United States Patent
Muenzel et al.

(10) Patent No.: US 6,214,243 B1
(45) Date of Patent: Apr. 10, 2001

(54) PROCESS FOR PRODUCING A SPEED OF ROTATION CORIOLIS SENSOR

(75) Inventors: Horst Muenzel, Reutlingen; Franz Laermer, Stuttgart; Michael Offenberg, Tuebingen; Andrea Schilp, Schwaebisch Gmuend; Markus Lutz, Reutlingen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/051,878

(22) PCT Filed: Oct. 17, 1996

(86) PCT No.: PCT/DE96/01969

§ 371 Date: Oct. 20, 1998

§ 102(e) Date: Oct. 20, 1998

(87) PCT Pub. No.: WO97/15066

PCT Pub. Date: Apr. 24, 1997

(30) Foreign Application Priority Data

Oct. 20, 1995 (DE) ............................................. 195 39 049

(51) Int. Cl.[7] ............................................. B81B 7/02
(52) U.S. Cl. ............................. 216/2; 216/57; 73/504.12; 73/504.4; 73/514.29; 73/777; 73/862.626; 361/280

(58) Field of Search .................................. 216/2, 57, 67, 216/72, 79, 99; 73/862.626, 504.4, 204.265, 504.12, 504.16, 504.32, 514.35, 777; 361/283.3, 280; 205/561, 565, 99

(56) References Cited

U.S. PATENT DOCUMENTS

| 5,447,067 | * | 9/1995 | Biebl et al. | 73/514.32 |
| 5,484,073 | * | 1/1996 | Erickson | 216/2 |
| 5,488,862 | * | 2/1996 | Neukermans et al. | 73/504.02 |
| 5,600,065 | * | 2/1997 | Kar et al. | 73/504.12 |
| 5,640,133 | * | 6/1997 | MacDonald et al. | 333/197 |
| 5,734,105 | * | 3/1998 | Mizukoshi | 73/504.02 |

* cited by examiner

Primary Examiner—Randy Gulakowski
Assistant Examiner—Allan Olsen
(74) Attorney, Agent, or Firm—Kenyon & Kenyon

(57) ABSTRACT

A process for the manufacture of a Coriolis rate-of-rotation sensor with oscillatory support masses spring-suspended on a substrate as well as driving means for the excitation of the planar oscillation of the oscillating masses and evaluation means for the determination of a Coriolis acceleration. Oscillating masses, driving means and integrated stops are structured in a common operation by means of plasma etching from a silicon-on-insulator (SOI) wafer.

14 Claims, 4 Drawing Sheets

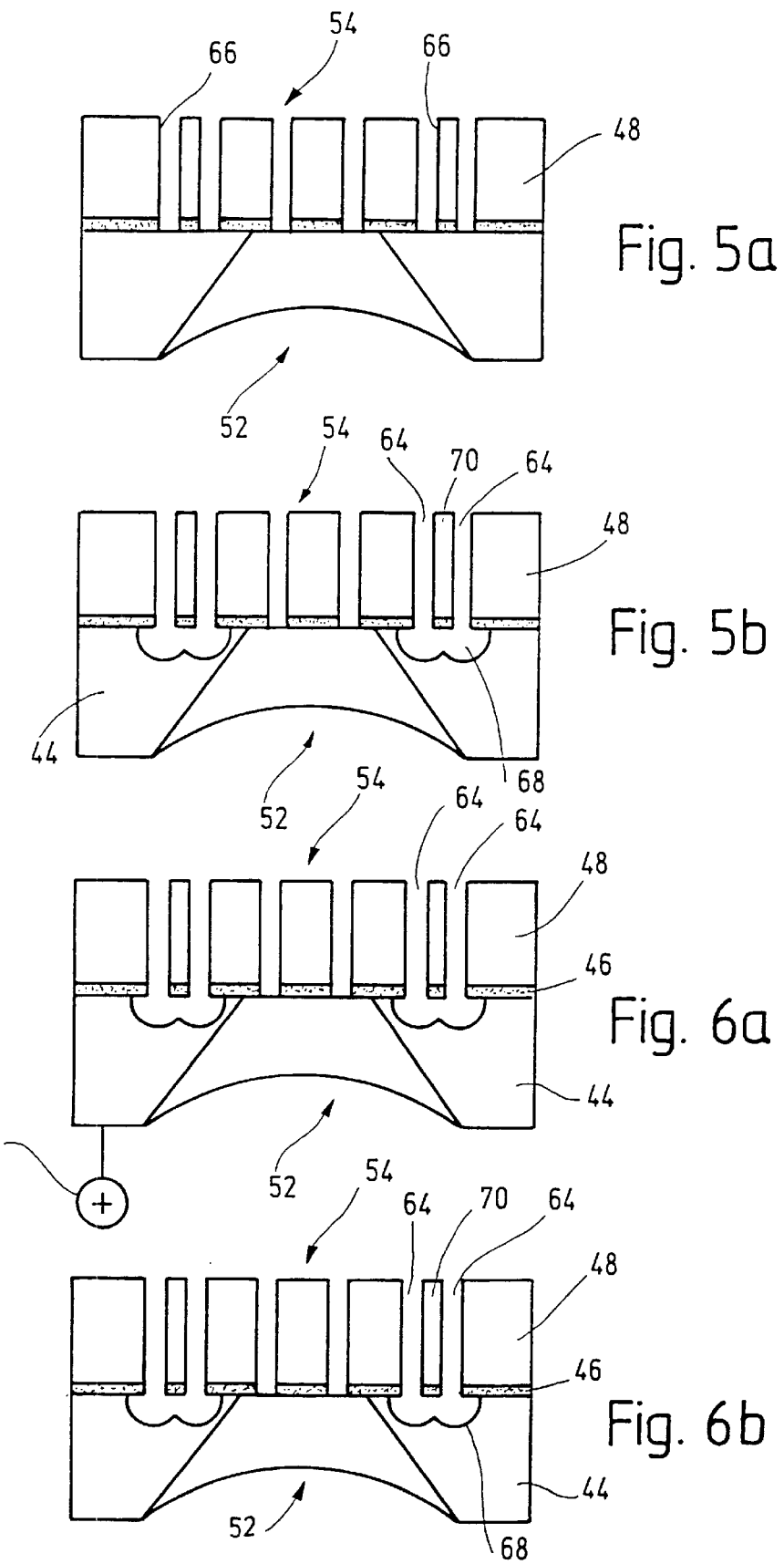

PROCESS FOR PRODUCING A SPEED OF ROTATION CORIOLIS SENSOR

FIELD OF THE INVENTION

The present invention relates to a process for the manufacture of a Coriolis rate-of-rotation sensor.

BACKGROUND INFORMATION

Sensors designed as Coriolis rate-of-rotation sensors are known. These sensors have deflectable oscillating (e.g., resonator) masses, spring-suspended (or resiliently-suspended) on a substrate, which support evaluators for the determination of Coriolis accelerations.

It is know to structure such Coriolis rate-of-rotation sensors through the plasma etching of the substrate structure (resonator or vibrating structure) using a bulk silicon membrane previously produced through time-controlled wet etching of the back side. A disadvantageous aspect of this approach is that exact process conditions must be maintained as a result of the time-controlled wet etching of the membrane, since otherwise membrane thicknesses, and thus structure heights, that is, the etching times required in the plasma etching process for etching-through from the front side, cannot be controlled.

SUMMARY OF THE INVENTION

The process according to the present invention is advantageous in.

The process, according to this invention, with the features cited in claim 1, has the advantage over the background art that the oscillatable substrate structures which support the structured acceleration sensors for measuring Coriolis acceleration can be easily and precisely structured. Since the oscillatory substrate structure, which supports both the evaluation means (arrangement) and the driving means, (arrangement) is structured by plasma etching from a silicon-on-insulator (SOI) wafer substrate, it is advantageously possible to conduct structuring generally independently of etching times. The process of etching, both wet etching from the back side of the wafer, as well as plasma etching from the front side of the wafer, stops automatically at the buried oxide, so that the set structure heights are exclusively determined by the thickness of the SOI layer, thus making it possible to conduct an over-etching, procedure that is, the respective etching process can be conducted for a longer period of time than would have been necessary, so that overall process reliability is increased in the course of structuring. The buried oxide simultaneously ensures the protection of the bottom side of the structure in the course of the process of plasma etching in addition to its stopping function of the etching process. Otherwise, the bottom side of the structure would be attacked after etch-through of the membrane window by the etching gases (fluorine radicals) which flow around the edges. It is also advantageously possible to initially structure the front side of the wafer in plasma on the wafer substrate so that a stable wafer is maintained to the last minute in the course of manufacture. The membranes can advantageously be produced-as a subsequent, final step—by means of process of wet or dry etching from the back side of the wafer, with the buried oxide, as described above serving as a seal for the already produced structured front side of the wafer. Through the buried oxide a quasi-sealing of the front side of the wafer from the back side of the wafer is achieved, which can be additionally supported by additional front side painting.

Another advantageous embodiment of the process according to the present invention is that the buried oxide can be easily removed without additional effort in the course of the sacrificial layer etching of the Coriolis acceleration recorder.

In another embodiment of the present invention simultaneously with the oscillating resonator masses which support the Coriolis acceleration sensors, overload limit stops integrated on the sensors are also structured. The integrated overload limit stops can be advantageously jointly structured out from the front side of the wafer from the SOI wafer substrate along with the oscillating masses and their springs by means of the process of plasma etching, without the need for complex additional measures for establishing external overload limit stops. In general through a process of plasma deep etching from the front side of the wafer it is possible to very easily structure a highly compact substrate structure for a rate-of-rotation sensor with integrated overload limit stops.

BRIEF DESCRIPTION OF THE DRAWINGS

FIG. 5a shows a first optional additional process step for creating the substrate structures.

FIG. 5b shows a second optional additional process step for creating the substrate structures.

FIG. 6a shows a first optional additional process step for creating the substrate structures for a further embodiment of the process according to the present invention.

FIG. 6b shows a second optional additional process step for creating the substrate structures for the further embodiment of the process according to the present invention.

DETAILED DESCRIPTION OF THE INVENTION

Figure 1:
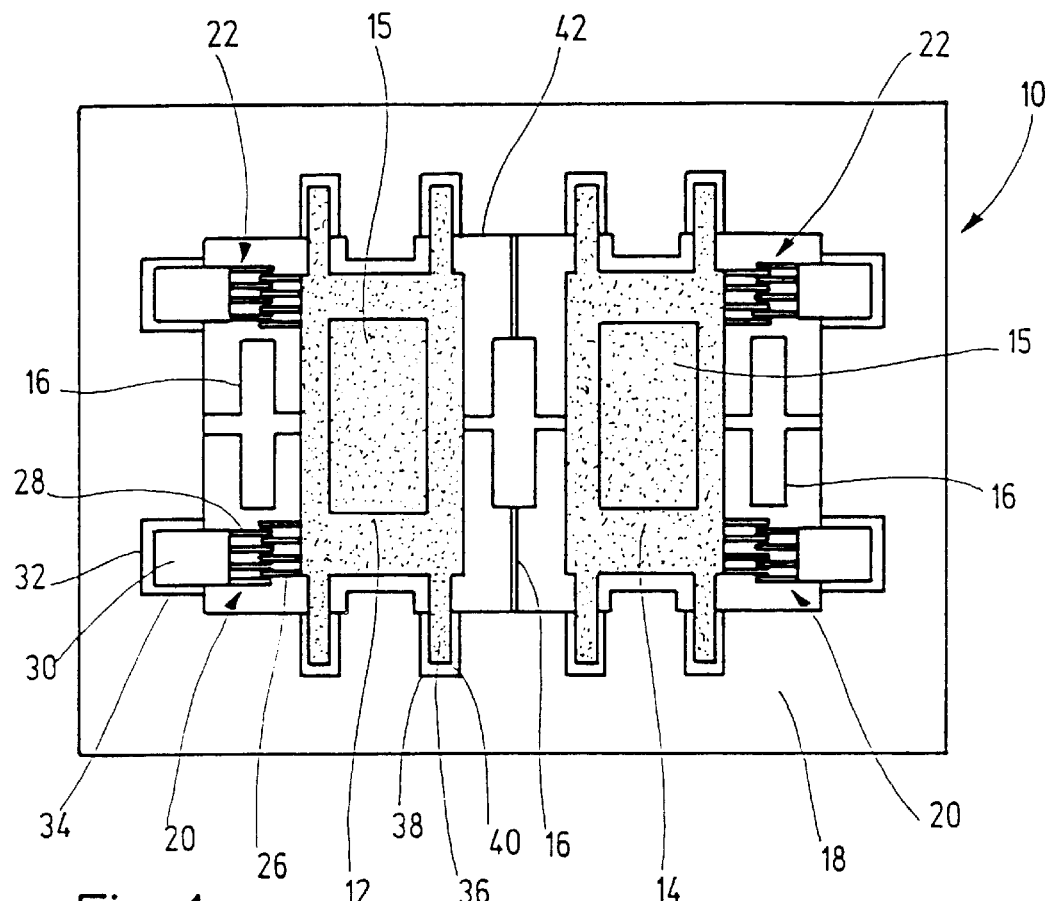
FIG. 1 shows a schematic top view of a first embodiment for a substrate structure of a rate-of-rotation sensor, according to the present invention.

FIG. 1 shows the top view of a rate-of-rotation sensor 10. Rate-of-rotation sensor 10 has two oscillating resonator masses 12 and 14. Oscillating masses 12 and 14 are connected to a base (substrate) 18 via springs 16. Springs 16 have a high aspect ratio, that is, their height is as great as possible in relation to their thickness. Springs 16 are thus designed to be soft in a planar oscillation plane and rigid perpendicularly to a planar oscillation plane. Oscillating masses 12 and 14, which simultaneously support acceleration sensors 15 for the detection of acceleration, are thus softly suspended in the planar oscillation plane and rigidly suspended perpendicularly to the planar oscillation plane. Oscillating masses 12 and 14 can also be provided with comb structures 20 and 22, respectively, in order to establish an electrostatic oscillation drive. Other types of drives, however, are also conceivable. Each of comb structures 20 and 22 has a comb 26 rigidly connected to oscillating masses 12 and 14 as well as a comb 28 intermeshed with comb 26 and connected to base 18. Comb 28 is attached to a socket 30 which is located in a recess 32 of base 18. As a result of the location of socket 30 in recess 32 the socket is surrounded by a trench-shaped structure 34 and electrically insulated laterally. The buried oxide of the SOI wafer design is responsible for vertical insulation.

Furthermore, oscillating masses 12 and 14 have on their front sides finger-shaped projections 36 which engage in recesses 38 of base 18. The projections 36 engaging with recesses 38 of base 18 are surrounded by a trench-shaped structure 40. As will be explained below sockets 30 have on their bottom a fixed, electrically insulated connection to base 18, while projections 36, after the completion of processing, that is, after sacrificial oxide etching, project freely into recesses 38, and thus no longer have a connection with base 18. Recesses 32 and 38 start out from an opening 42 within which oscillating masses 12 and 14 as well as springs 16 are located. As is shown in the cross-sectional illustration of in FIG. 2, the surfaces of base 18 as well as of oscillating masses 12 and 14, of comb structures 20 and 22, and of projections 36 all lie in approximately the same planar plane.

The substrate structure (oscillating masses 12, 14, and springs 16) shown in FIG. 1 generate Coriolis accelerations which are detected by the additionally provided surface-micromechanical acceleration sensors 15. Oscillating masses 12 and 14 are set into planar oscillation motion by applying an electrical alternating current through electrostatic forces via comb structures 20. Other types of drives, are, conceivable, such as electromagnetic drives using the Lorentz force acting on a conductor with current flowing through it within a magnetic field. Within the framework of the description presented herein, the principle of operation of the rate-of-rotation sensor 10 will not be dealt with in further detail, since its principle of operation is generally known.

Projections 36 engaging with recesses 38 provide a vertical motion limit for oscillating masses 12 and 14. In this manner bottom stops for oscillating masses 12 and 14 are formed which establish overload/shock protection.

Figure 2:
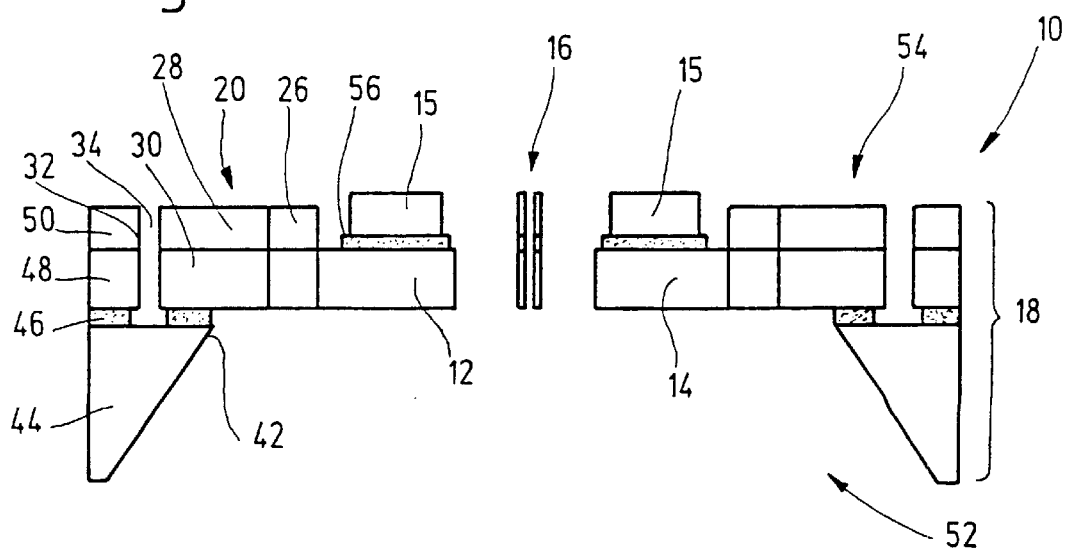
FIG. 2 shows a cross-section through the rate-of-rotation sensor illustrated in FIG. 1.

FIG. 2 shows a cross-section through rate-of-rotation sensor 10. The same components as shown in FIG. 1 have the same reference numbers. The cross-section clearly shows the layered design of rate-of-rotation sensor 10. Rate-of-rotation sensor 10 has a bulk substrate 44 upon which a silicon oxide layer ($SiO_2$) is formed as bottom buried oxide 46. An SOI layer 48 is provided on buried oxide 46 followed by an EpiPoly layer 50. Bulk substrate 44 has an opening 42 which is spanned in a membrane-like manner by SOI layer 48 and EpiPoly layer 50. Oscillating masses 12 and 14, springs 16, comb structures 20 and 22, socket 30, projections 36, as well as recesses 32 and 38 are structured within SOI layer 48 and EpiPoly layer 50. The boundary between bulk substrate 44 and the structural elements of rate-of-rotation sensor 10 is formed by bottom buried oxide 46. Bottom buried oxide 46 subdivides rate-of-rotation sensor 10 into a wafer back 52 and a wafer front 54. Oscillating masses 12 and 14 and springs 16 can be made of the relatively thick SOI layer 48 upon which a top silicon oxide layer is structured as top buried oxide 56. Acceleration recorder 15 is attached to top buried oxide 56 using EpiPoly technology. Thus, oscillating masses 12 and 14 are formed from a substrate structure including SOI layer 48 and acceleration recorder 15 attached thereon.

On the basis of another embodiment according to the present invention, instead of making acceleration recorder 15 from EpiPoly, material this recorder can also be structured using SOI technology ($SOI^2$ approach). Buried oxide layer 46 or 56 can be produced in a generally known manner on the basis of thermal oxidation and subsequent bonding and grinding or bonding and etch back processes.

Figure 3A:
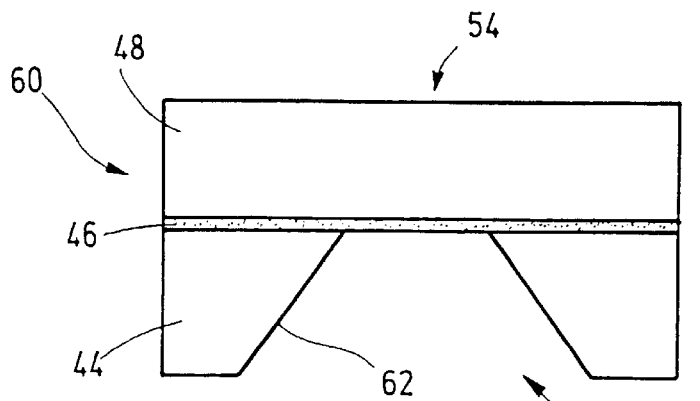
FIG. 3a shows a first step for a first embodiment of a process for creating of the substrate structures of the rate-of-rotation sensor according to the present invention.
Figure 3B:
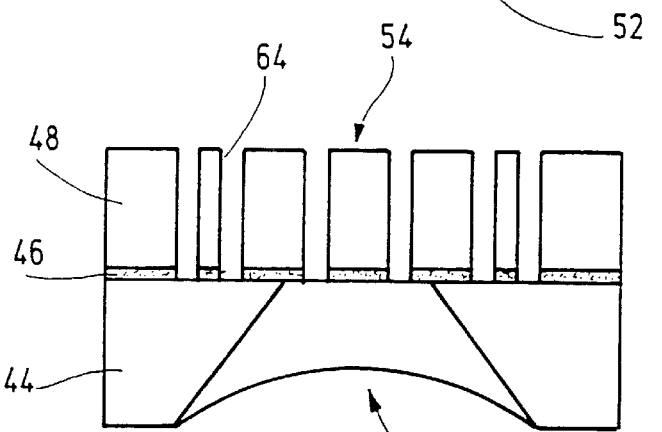
FIG. 3b shows a second step for the first embodiment of the process for creating of the substrate structures of the rate-of-rotation sensor according to the present invention.

The manufacture of a rate-of-rotation sensor 10 is explained in a first embodiment of the processing according to the present invention on the basis of FIGS. 3a and 3b. As shown in FIG. 3a the process starts with an SOI wafer 60 with a buried oxide layer 46. Wet-chemical etching is performed from wafer back 52. The wet-etching medium (caustic potash solution) is channeled onto wafer back 52 via a mask not shown here, so that the crystalline structure of silicon wafer 60 produces a V-shaped opening 62. Buried oxide 46 is resistant to the etching medium used (hot lye) and thus serves as an etching stop for the wet-etching process. The structure of this well-defined etching stop for the wet-etching process results in the membrane (SOI layer 48) left on wafer front 54, within which the substrate structure of rate-of-rotation sensor 10 will later be structured, having a well-defined thickness which is exclusively determined by the thickness of SOI layer 48. The thickness of layer 48 is thus independent of the etching time within which the etching of opening 62 from wafer back 52 takes place. Buried oxide 46 simultaneously constitutes a protective layer for wafer front 54 against the etching medium, such as KOH, hydrofluoric acid+$HNO_3$ or plasma-etching gas TMAH (tetramethylammoniumhydroxide). The acceleration sensors 15 shown in (FIG. 2) not shown here are also attached to the substrate structure.

In a next process step, shown in FIG. 3b, an anisotropic plasma deep-etching process is conducted upon wafer front 54. In the process a mask, not shown, typically a photoresist, is applied to wafer front 54, with the mask corresponding to the subsequent structuring of rate-of-rotation sensor 10. Thus, the geometry of oscillating masses 12 and 14, comb structures 20 and 22, socket 30, springs 36, recesses 32 and 38, as well as springs 16 shown in (FIG. 1), are determined by the mask. The onsetting plasma deep-etching process trenches out the nonmasked area from SOI layer 48. Again, buried oxide 46 serves as the stop for this plasma deep-etching process from wafer front 54. Buried oxide layer 46 can subsequently be simply removed in the areas in which, as shown in the cross-section drawing in FIG. 2, provision has been made for the free oscillating structures of rate-of-rotation sensor 10. Thus, a rate-of-rotation sensor 10 can be simply structured.

Simultaneously with the structuring of rate-of-rotation sensor 10, projections 36 shown in FIG. 1 can be structured which constitute overload/shock protection for rate-of-rotation sensor 10. As the result of an appropriate design of the mask, a trench-shaped structure 40 shown in (FIG. 1) is etched out in the course of the process of plasma deep-etching, resulting in projections 36, with these projections being designed as one piece with oscillating masses 12 and 14. Projections 36 can thus be derived from the already existing design of wafer 60 without complex additional measures. Since projections 36 co-oscillate with oscillating masses 12 and 14, they may not have any connection with bulk substrate 44. To this end, projections 36 must be exposed, i.e., detached, from bulk substrate 44, through underetching buried oxide 46 in the area of projections 36. This also takes place without additional effort during the sacrificial oxide-etching of surface micromechanical acceleration recorder 15. In this instance a thickness between approximately 1 to 3 μm can be established depending upon the thickness of buried oxide layer 46. This will generally be sufficient to allow the free oscillation of substrate structures 12 and 14.

Figure 4A:
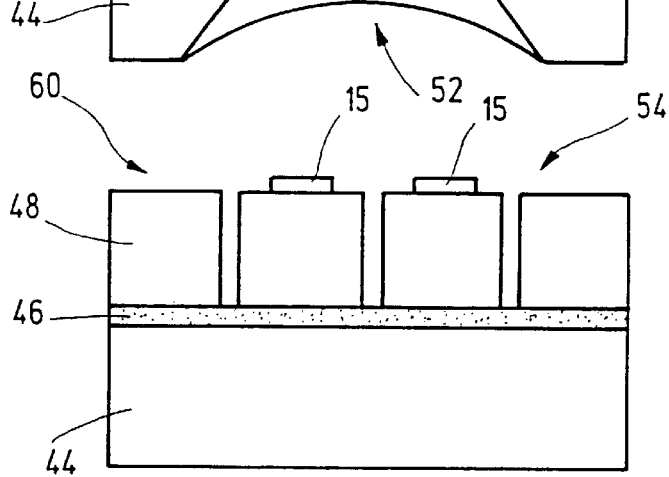
FIG. 4a shows a first step for a second embodiment of the process for creating of the substrate structures of the rate-of-rotation sensor according to the present invention.
Figure 4B:
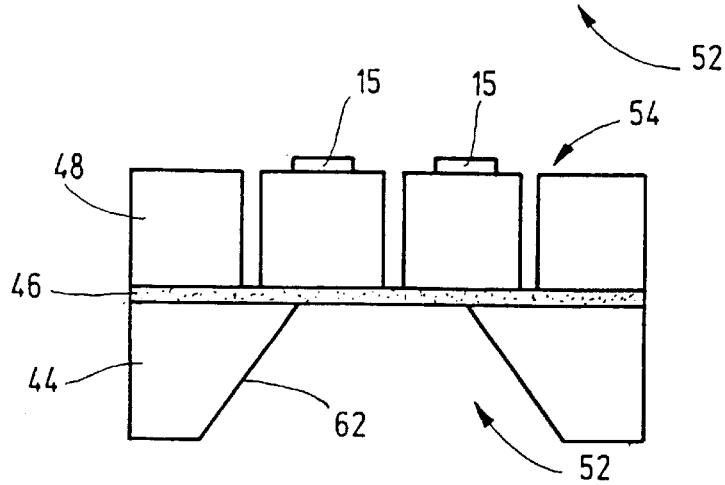
FIG. 4b shows a second step for the second embodiment of the process for creating of the substrate structures of the rate-of-rotation sensor according to the present invention.

In a second embodiment of the process according to the present invention of the invention, shown in FIGS. 4a and 4b it is advantageously possible to conduct the etching process from wafer back 52 only after the completion of the complete processing of wafer front 54. This has the advantage of resulting in the availability of a generally more stable wafer 60, for the processing of wafer front 54, without back etching openings whose stability has not yet been influenced by opening 62. Reference to the previously described embodiment of the present invention is made with respect to the details of front side processing and etching from the back. The remaining buried oxide layer 46 beneath the structures structured on wafer front 54 simultaneously ensures very good protection against the attack of etching from wafer back 52.

If this distance between buried oxide layer 46 and the substrate structure thus created is not sufficient in specific instances of application, then, as shown in FIGS. 5a and 5b, the spacing between projections 36 and bulk substrate 44 can be increased through isotropic plasma underetching of projections 36 in bulk substrate 44. In the process the side walls of created trenches 64 (in this instance trench 64 which will later result in trench-shaped structure 40) are rendered passive to an isotropically attacking plasma medium. To this end the side walls can be typically provided with a teflon-like plasma film 66. Isotropic plasma underetching subsequently takes place within bulk substrate 44 so that clearances 68 are obtained there. In the process, clearances 68 connect two adjacent trenches 64 so that no contact points exist any longer with bulk substrate 44 between the area 70 remaining between trenches 64, that is, in this selected example, projections 36.

According to another design variant it is possible, in accordance with the process step shown in FIGS. 6a and 6b, after the plasma deep-etching of trenches 64 and the removal of buried oxide 46 at the base of trenches 64, to apply an anodic voltage 70 to bulk substrate 44. The exposed surfaces of bulk substrate 44 in trenches 64 are treated with an electrolyte 72, typically aqueous hydrofluoric acid and isopropanol. This results in an electrochemical dissolution of areas of bulk substrate 44 which also result in the formation of clearances 68 (FIG. 4b). In the process, SOI layer 48, having the structure created on wafer front 54, is protected from electrochemical decomposition because this structure is electrically insulated from anodic potential 70 by buried oxide 46.

This approach thus generally provides the ability to structure, by means of a simply controllable process of plasma deep-etching, within SOI layer 48, a rate-of-rotation sensor 10 which has an efficient electrostatic comb drive (structure) 20 for excitation of the planar oscillatory movement of oscillating masses 12 and 14 or a capacitive comb pickoff 22 for detection of oscillatory movement. Other types of drives are conceivable, typically electromagnetic drives using the Lorentz force acting upon a conductor loop within an external magnetic field. Buried oxide 46 provides top quality dielectric insulation of the structures. Lateral insulation is simply achieved via deep-trenching of trench-shaped structures 32 around socket 30. Sockets 30 are not etched away in the course of sacrificial oxide-etching since these sockets have greater dimensions.

Figure 7:
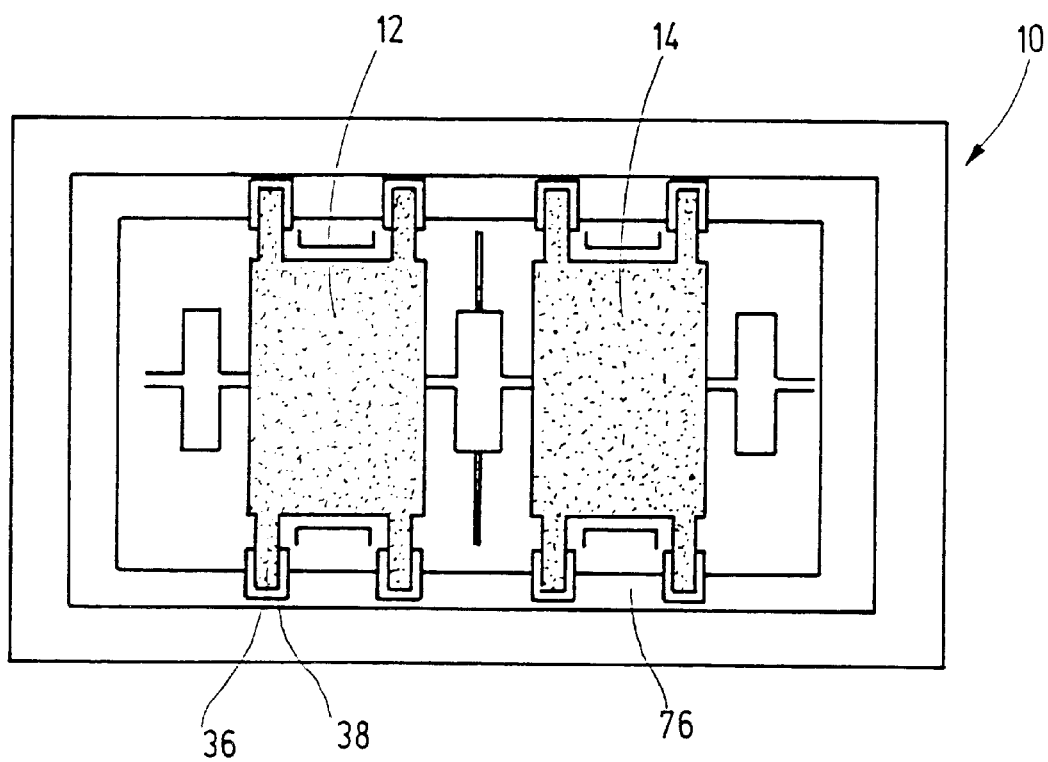
FIG. 7 shows a schematic top view of a second embodiment for the substrate structure of the rate-of-rotation sensor according to the present invention.
Figure 8:
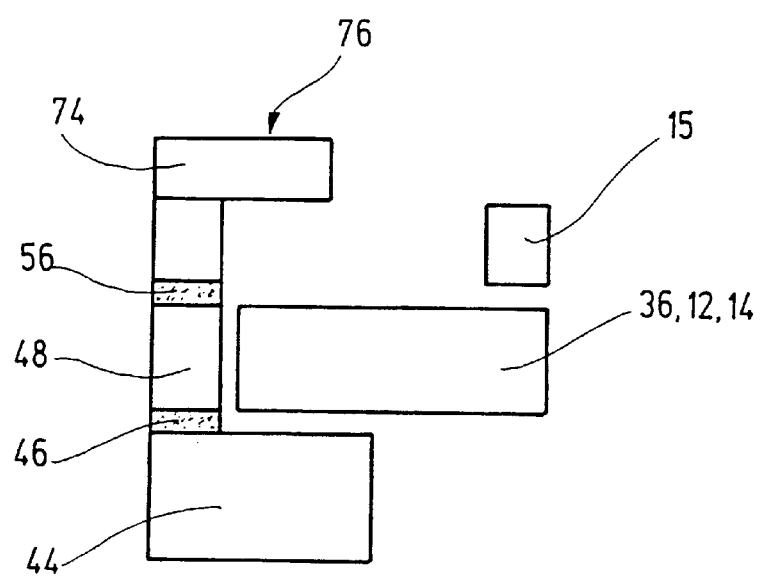
FIG. 8 shows a cross-section view through the rate-of-rotation sensor illustrated in FIG. 7.

FIGS. 7 and 8 show another embodiment of a rate-of-rotation sensor 10, where the same components as in the previous figures with the same reference numbers are provided. In addition to the design of the bottom stop intended to protect acceleration sensor 10 against overload/shock via the engagement of projections 36 into recesses 38, in this embodiment a top stop 74 is provided which overlaps projections 36. Top stop 74 is created by etching away projections 36 up to top buried oxide 56 shown in (FIG. 6). This etching away process can advantageously be achieved simultaneously with the process of plasma deep-etching to create the structures of top acceleration sensors 15 (trenches 64 as shown in FIGS. 3 and 4) and requires no additional process steps.

In the case of an upper EpiPoly layer, the buried oxide can, prior to the precipitation of the thick poly layer, either be suitably prestructured, or etched through in the course of the deep-trench process for the etching of the oscillatory substrate structure by switching from etching plasma chemistry to oxide etching chemistry, which is advantageous with respect to the $SOI^2$ process. Thus, there arises a height difference between the surface of projection 36 (bottom SOI) and the surface of the surrounding mainland silicon (base 18) (EpiPoly or top SOI) equal to the thickness of the top EpiPoly or SOI layer, e.g., 12 μm. Then through the application of a fixed-resist, bridge-like stops 74 are produced in such a manner across projections 36 that the projections when deflected upwards by the thickness of the top EpiPoly or SOI layer stop at the bottom of stops 74. The fixed resist can either be prestructured photolithographically prior to lamination and then applied after adjustment, or application and subsequent photolithography of the fixed resist can take place across the entire surface prior to sacrificial layer etching of the surface micromechanical sensor structures where wet development on the wafer is still permissible.

Stops 74 can typically be so produced that a closed fixed resist frame 76 surrounds the entire sensor structure as shown in FIG. 8.

It is also possible, on the basis of another embodiment of the present invention not shown, to attach a cap in such a manner on base 18, for example through gluing or soldering, so that the edge of the cap covers stops 36 in such a manner that the corresponding stopping effect occurs, with the cap edge thus corresponding to overlapping fixed resist frames 74 and 76.

What is claimed is:

1. A process for manufacturing a rate-of-rotation sensor including a substrate structure, the substrate structure including deflectable resonator masses and springs, the deflectable resonator masses situating an evaluation arrangement for detecting Coriolis accelerations, and a driving arrangement for exciting a planar vibration of the deflectable resonator masses, the deflectable resonator masses being resiliently suspended on a substrate, the process comprising the steps of:
   a) in a single sequence operation, plasma-etching the substrate structure and a driving arrangement into a top side of a silicon-on-insulator (SOI) wafer, the SOI wafer including a buried oxide layer;
   b) wet-etching an opening through a bulk substrate and underneath the substrate structure and the driving arrangement, the bulk substrate forming a rear side of the SOI wafer; and c) removing the buried oxide layer underneath the substrate structure and the driving arrangement.

2. The process according to claim 1, wherein the buried oxide layer includes an etching stop for the plasma etching procedure at the top side and at the rear side of the SOI wafer.

3. The process according to claim 1, wherein the buried oxide layer includes an etching stop for the plasma-etching step, the plasma etching step further including a substep of producing an SOI membrane layer within the SOI wafer from the rear side of the SOI wafer.

4. The process according to claim 3, further comprising the step of:

d) after producing the rate-of-rotation sensor via the front side of the SOI wafer, exposing the SOI membrane layer, the substrate structure and the driving arrangement via the rear side of the SOI wafer using a wet etching procedure.

5. The process according to claim 3, wherein the substrate structure is situated in the SOI membrane layer.

6. The process according to claim 1, further comprising the step of:

e) simultaneously with step a), configuring overload stops for the substrate structure.

7. The process according to claim 6, wherein the substrate structure includes projections situated above the buried oxide layer, and further comprising the steps of:

f) configuring trench-shaped structures around the projections to form the overload stops; and g) after step f), removing the buried oxide layer as a sacrificial oxide layer.

8. The process according to claim 7, wherein the bulk substrate is situated beneath the projections, and further comprising the step of:

h) via a protected sidewall, isotropically plasma underetching the bulk substrate to produce clearances, the clearances being produced for increasing a spacing between the projections from a base and for increasing a vertical mobility of the deflectable resonator masses.

9. The process according to claim 7, wherein the protected sidewall includes a teflon-coated sidewall.

10. The process according to claim 7, wherein the bulk substrate is situated beneath the projections, and further comprising the step of:

i) electrochemically etching the bulk substrate to form clearances, the clearances being formed to enlarge clearances for a vertical motion.

11. The process according to claim 1, further comprising the step of:

j) producing top stops and bottom stops for seismic masses.

12. The process according to claim 11, wherein the substrate structure includes projections, and further comprising the step of:

k) configuring bridge-shaped stops over the projections.

13. The process according to claim 12, wherein the bridge-shaped stops include a fixed-resist frame covering an entire structure of the rate-of-rotation sensor.

14. The process according to claim 1, wherein the substrate structure includes at least one projection, and further comprising the step of:

l) applying a cap to the at least one projection, wherein an edge of the cap forms a stop.

* * * * *

UNITED STATES PATENT AND TRADEMARK OFFICE
CERTIFICATE OF CORRECTION

PATENT NO.    : 6,214,243 B1
DATED         : April 10, 2001
INVENTOR(S)   : Muenzel et al.

It is certified that error appears in the above-identified patent and that said Letters Patent is hereby corrected as shown below:

Column 1,
Line 15, change "know" to -- known --.
Line 30, change "in." to -- in --.
Lines 30-32, delete ". The process, according to this invention, with the features cited in claim 1, has the advantage over the background".
Line 37, change "driving means, (arrangement)" to -- driving means (arrangement), --.
Line 46, change "over-etching, procedure" to -- over-etching procedure, --.

Column 2,
Line 6, change "resonator" to -- (resonator) --.
Line 60, change "resonator" to -- (resonator) --.

Column 3,
Line 20, change "below" to -- below, --.

Column 4,
Line 36, change "shown in (FIG. 2)" to -- (shown in FIG. 2) --.
Line 45, change "shown in (FIG. 1)" to -- (shown in FIG. 1) --.
Line 59, change "shown in (FIG. 1)" to -- (shown in FIG. 1) --.

Column 5,
Line 10, change "4a and 4b" to -- 4a and 4b, --.
Line 28, change "36" to -- 36 (FIG. 1) --.
Line 30, change "36" to -- 36 (FIG. 1) --.
Line 34, change "teflon" to -- TEFLON --.

UNITED STATES PATENT AND TRADEMARK OFFICE
CERTIFICATE OF CORRECTION

PATENT NO.    : 6,214,243 B1
DATED         : April 10, 2001
INVENTOR(S)   : Muenzel et al.

It is certified that error appears in the above-identified patent and that said Letters Patent is hereby corrected as shown below:

Column 6,
Line 12, change "shown in (FIG. 6)" to -- (shown in FIG. 6) --.
Line 54, change "situating" to -- bearing --.

Signed and Sealed this

Fifth Day of November, 2002

Attest:

Attesting Officer

JAMES E. ROGAN
Director of the United States Patent and Trademark Office